(12) United States Patent
Cornelius et al.

(10) Patent No.: US 6,417,463 B1
(45) Date of Patent: Jul. 9, 2002

(54) DEPOPULATION OF A BALL GRID ARRAY TO ALLOW VIA PLACEMENT

(75) Inventors: William P. Cornelius, Los Gatos; Paul A. Baker, Los Altos, both of CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 09/678,542

(22) Filed: Oct. 2, 2000

(51) Int. Cl.$^7$ .............................................. H01R 23/68
(52) U.S. Cl. ..................... 174/263; 257/737; 257/738; 361/767
(58) Field of Search ................... 174/203; 257/778, 257/691, 780, 698, 786, 737, 738, 739; 361/767, 777, 783

(56) References Cited

U.S. PATENT DOCUMENTS 5,637,920 A * 6/1997 Loo .......................... 257/778
5,717,245 A * 2/1998 Pedder ....................... 257/780
5,982,633 A * 11/1999 Jeansonne ................... 361/777
6,114,769 A * 9/2000 Thompson ................... 257/780
6,235,997 B1 * 5/2001 Asada et al. ................. 257/691

\* cited by examiner

*Primary Examiner*—Albert W. Paladini
(74) *Attorney, Agent, or Firm*—Blakely, Sokoloff, Taylor & Zafman LLP

(57) ABSTRACT

The present invention provides an apparatus and methods for the functionality of an integrated circuit. An exemplary embodiment according to an aspect of the present invention includes a ball grid array having open spaces therein. Within the open spaces, pairs of opposite polarity vias are clustered to minimize current path inductance by exploiting mutual inductance between vias of opposite current flow. In an illustrative embodiment, capacitors are coupled to the vias to further reduce current path inductance.

24 Claims, 9 Drawing Sheets

DEPOPULATION OF A BALL GRID ARRAY TO ALLOW VIA PLACEMENT

FIELD OF THE INVENTION

The present invention relates to packages for integrated circuits having ball grid arrays. More particularly, the present invention provides a ball grid array having open spaces in which vias are positioned.

BACKGROUND

Presently used to mate packages for integrated circuits with printed circuit boards, ball grid arrays (BGA's) are leadless, surface-mounted packages in which solder balls interconnects cover the bottom surface of the package in a checkerboard fashion. Typically, a mass reflow process is used to attach BGA's to printed circuit boards (PCB's), a term generally used for printed circuit configurations such as rigid or flexible, single, double, or multilayered boards that are completely processed. Integrated circuit (IC) is the term generally used for a microelectronic semiconductor device consisting of many interconnected transistors and other components. Typically, IC's are fabricated on a small rectangle called a die that is cut from a silicon wafer known as a substrate. Different areas of the substrate are "doped" with other elements to make them either "p-type" or "n-type." Polysilicon or aluminum tracks are etched in one to three (or more) layers deposited over the substrate's surface(s). The die is then connected into a package using gold wires, which are welded to "pads," usually found near the edge of the die.

Ball grid arrays formed on multilayer substrates typically incorporate within the BGA pattern drilled holes in laminate called vias, which connect different layers of circuitry. Typically, at least one via is positioned between two diagonal balls.

Inductance is the ability of a conductor to produce an induced voltage when cut by a magnetic flux. A conductor is a material capable of conveying an electric current. Virtually all conductors have inductance, but the amount of inductance associated with each conductor varies according to a number of factors such as type of conductive material, shape of the conductor, length of the conductor, and so forth. For example, a shorter wire has less inductance than a long wire because less conductor length cut by a magnetic flux produces less voltage. Similarly, a straight wire has less inductance than a coiled wire because the conductor concentrates more conductor length in a given area of flux.

One characteristic of inductors is that the faster the speed at which the flux changes, the more voltage is induced. The flux may take the form of a change in current. For example, alternating current (AC) circuits continually produce an induced voltage because the current is continuously changing. The faster the current changes, the higher the induced voltage, which always opposes the change in current. If current is increased, the polarity of the induced voltage opposes the increase in current, and vice versa. However, it is not necessary for the current to alternate directions. Inductance affects DC circuits whenever the value of the DC current changes, such as when a DC circuit is turned on and off.

There are four types of inductance: system inductance, self-inductance, mutual inductance, and stray inductance. System inductance is a combination of all the self inductances, mutual inductances, and stray inductances found within a circuit. Self inductance is the ability of a conductor to induce voltage in itself when the current changes. Mutual inductance typically occurs whenever two conductors are positioned closely together such that a varying flux resulting from a change in current in Conductor A cuts across and induces voltage in Conductor B. This induced voltage, in turn, generates a magnetic flux that cuts across and induces a voltage in conductor A. Because a current in one conductor can induce voltage in the adjacent conductor, the conductors are said to have mutual inductance. Stray inductance is the inductance of any wiring not included in discrete inductors, for example, traces, capacitors, $V_{ss}$ and $V_{dd}$ balls, etc. In most cases, stray inductance is negligible. However, in high frequency circuits, where the current changes very quickly, stray inductance can have appreciable effects. To offset this appreciable effect, traces. leads, and current return path are usually kept as short as possible.

Each of these types of inductance discussed above seriously affects, and in some cases limits, the i/o speeds of integrated circuits. For example, in the case where all the bus outputs of a circuit simultaneously switch the same way, the circuit is deluged with a tidal wave of current. This current surge generates an appreciable induced voltage in the circuit's conductors. The induced voltage flowing opposite to the wave of current, reduces the amount of current flowing through the circuit, thereby slowing the rate of current flow. It is clear that faster i/o times will result if system inductance can be minimized. To minimize system inductance, various embodiments of the present invention create a void or voids by removing a ball or balls from the ball grid array, shorten the lengths of trace routing paths and the length of the return current path as much as possible, and facilitate routing of leads and traces by placing pairs of vias within a void area or areas.

The benefit of the present invention is that it provides a smaller sized package area, hence a lower manufacturing cost, while not compromising, but improving $V_{dd}$ and $V_{ss}$ current path (e.g. return current path) inductance, which in turn, relates to i/o speed. Additionally, the present invention provides vias having a mutual inductance between + and − polarities, and provides mounting sites for capacitors that have very short routes to corresponding vias. Furthermore, the present invention maintains or enhances routability.

In a circuit board, the inductance of the return current path lies both in the package and in the main PCB that the package mounts to. The vias as referred to in this text are for connections within the main PCB. In particular, the vias for the bypass capacitors which conduct current from top to bottom of the PCB can have significant inductance. In fact, via inductance is approximately ten times (10×) the ball inductance. Because it is desirable to minimize the system inductance, not just the ball inductance, the present invention creates regions for more vias by removing balls.

In summary, problems common in the art include low mutual inductance between vias of opposite directed current flow, a shortage of routing channels, increased board size, increased cost of manufacturing, increased routing inductance, and lengthened current paths. Solutions to these and similar problems are provided by various embodiments of the present invention.

SUMMARY OF THE INVENTION

In one embodiment, a ball grid array (BGA)is positioned on one surface of a multilayer substrate. The array has a first density of balls, and a first open space therein that has a second density of balls lower than the first density of balls. A via or a pair of vias may be positioned within the first open space. In one embodiment, a ground via and a power via are combined to form a via pair. In another embodiment, capacitors are connected to the vias.

Various examples for practicing the invention, other advantages, and novel features thereof will be apparent from the following detailed description of various illustrative preferred embodiments of the invention, reference being made to the accompanying drawings.

BRIEF DESCRIPTION OF THE DRAWINGS

FIG. 6 also illustrates how ground and power vias may be paired together to achieve maximum mutual inductance.

DETAILED DESCRIPTION OF THE INVENTION

Various preferred embodiments of the present invention are now described, reference being made to the accompanying drawings. It will be understood that the sequential steps depicted in the Figures are illustrative only, and that a BGA may be created according to various embodiments of the present invention by similar methods.

Figure 1:
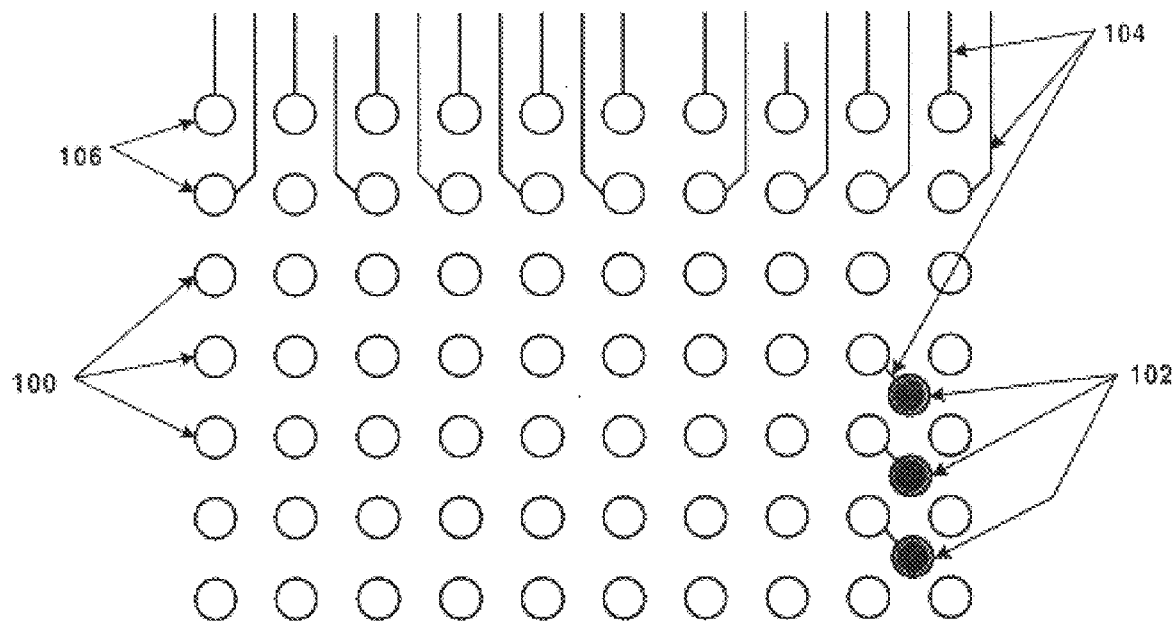
FIG. 1 is an overhead view of a typical ball grid array (BGA) design common in the electrical arts.

FIG. 1 is an overhead view of a typical ball grid array (BGA) design showing the placement of balls 100, vias 102, and traces 104. This BGA, like others typical in the art, has a ball pitch (center-to-center distance between balls) of approximately 1.0 mm. As illustrated in FIG. 1, limitations in trace width and trace-to-trace spacing require vias 102 to be interspersed among balls 100. In the BGA of FIG. 1, only the two exterior rows 106 of balls 100 can be routed along the surface of the substrate to other connections. Balls 100 remaining within the interior of the BGA must be routed to other connections using vias. In the BGA of FIG. 1, circuit functionality and i/o timing (speed) are limited by lengthened return current paths and no or little mutual inductance between vias of opposite current flow.

Figure 2:
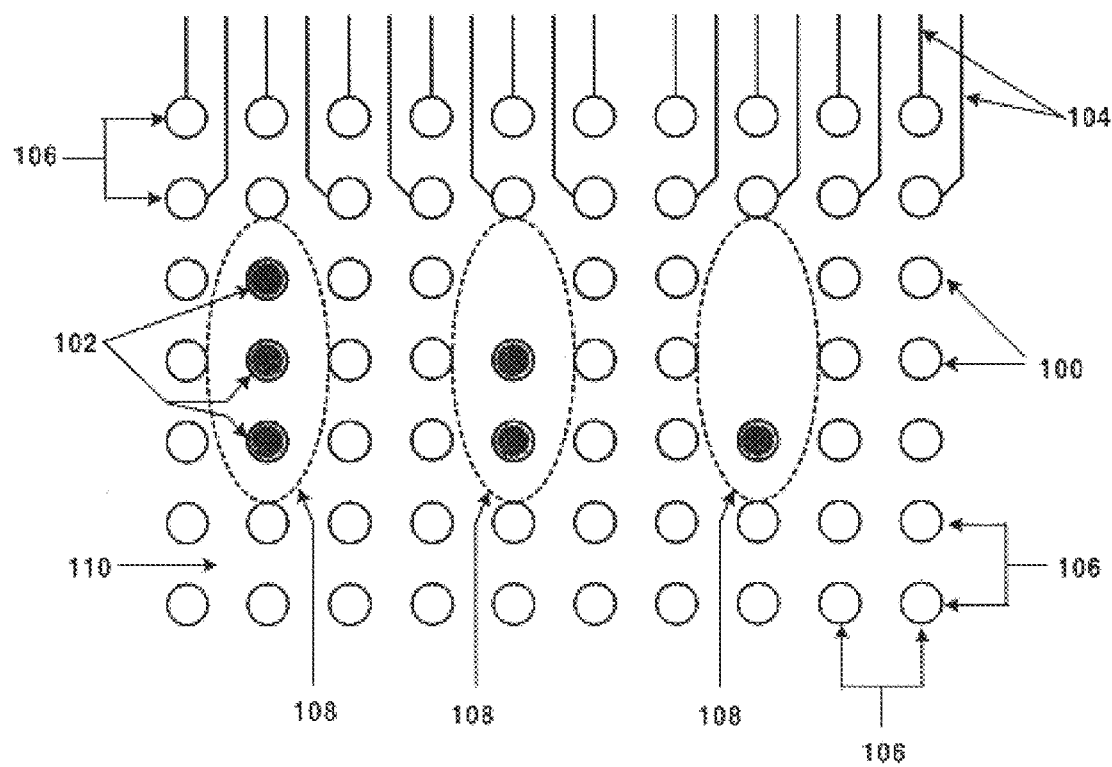
FIG. 2 is an overhead view of a BGA design showing areas of the BGA selected for depopulation.

FIG. 2 depicts an overhead view of a BGA modified according to a preferred embodiment of the invention. The BGA of FIG. 2 includes open spaces 108 and 110. Open spaces 110 are the spacing between individual balls 100. Open spaces 108 are larger in area than open spaces 110. In an embodiment, open spaces 108 may be formed by removing balls from an existing BGA or BGA design (depopulating a BGA). Alternatively, open spaces 108 may be created designing a BGA from scratch. In the embodiment illustrated in FIG. 2, some vias 102 are removed from among balls 100, the ball pitch is changed to approximately 1.0 mm, and 0.25 mm via pads are used. In the BGA of FIG. 2, circuit functionality and i/o timing are enhanced by shortened return current paths.

Figure 3:
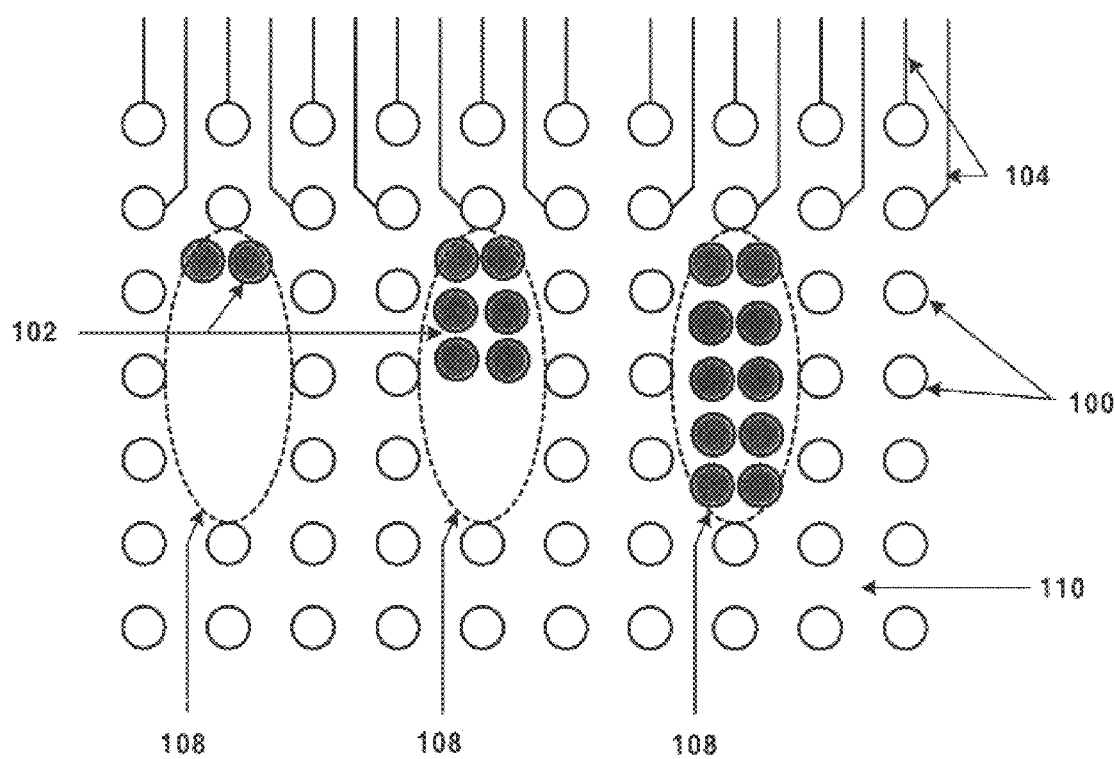
FIG. 3 is an overhead view of a BGA modified according to an embodiment of the present invention showing placement of via pairs within the depopulated areas.

FIG. 3 illustrates a BGA further modified according to an embodiment of the present invention. In the embodiment depicted in FIG. 3, vias 102 are positioned within open spaces 108. In some embodiments, the size of open space 108 may approximate the area filled by at least one ball. In a preferred embodiment, however, the size of open space 108 is approximately equal to the area encompassed by three or more adjacent balls. It is understood that the ball grid array has a first density of balls and that open space 108 has a second density of balls less than the first density of balls. Moreover, at least one ball 100 may be collocated with at least one via 102 within an open space 108. Open space 108 provides an area for optimal placement of via pairs, which lowers system inductance and enhances circuit functionality.

The number of vias positioned within an open space 108 is at least one, it being understood that the size of open space 108 and the size of the vias 102 positioned therein determines the approximate number of vias that can be contained within open space 108. In a preferred embodiment, at least three pairs of vias (approximately 3 power vias and 3 ground vias) are clustered within the interior of an open space 108, as shown in FIG. 3. The remaining four vias are signal vias. The use of opposite sign mutual inductance terms between $V_{dd\_}$ vias and $V_{ss\_}$ vias was leveraged to reduce path inductance and hence to reduce the SSO times. The general rule is to place opposite polarity vias as close together as possible to maximize the mutual inductance. Vias on the same net (polarity) should be separated as much as possible within the area constraints without lengthening routing paths. The patterned concentration of vias provides several unique advantages over other designs, namely that there are routing channels between via clusters on many of the layers, there are sites on the back side of the package for placement of bypass capacitors, and there are shortened routing paths. Additionally, the patterned concentration of vias allows for optimal use of available space, meaning that more vias may be positioned within a given board area than was formerly possible using prior BGA designs.

The density of an open space 108 may be measured and compared to the density of a ball grid array in the following preferred manner. To start, an open area 108 is randomly selected. A first square is constructed about the selected open area 108. The dimensions of the square are such that the interior of the square entirely encompasses all of open area 108 and includes at least one row of balls slightly within and along each edge of the square. Next, a second square of the same dimensions as the first is constructed. This second square is positioned over another area of the ball grid that does not contain an open space 108, but which may contain at least one open space 110. The densities of each square are calculated by counting the number of balls within each square, and the respective densities are compared. In embodiments of the present invention, the density of the first square will be less than the density of the second.

Figure 4A:
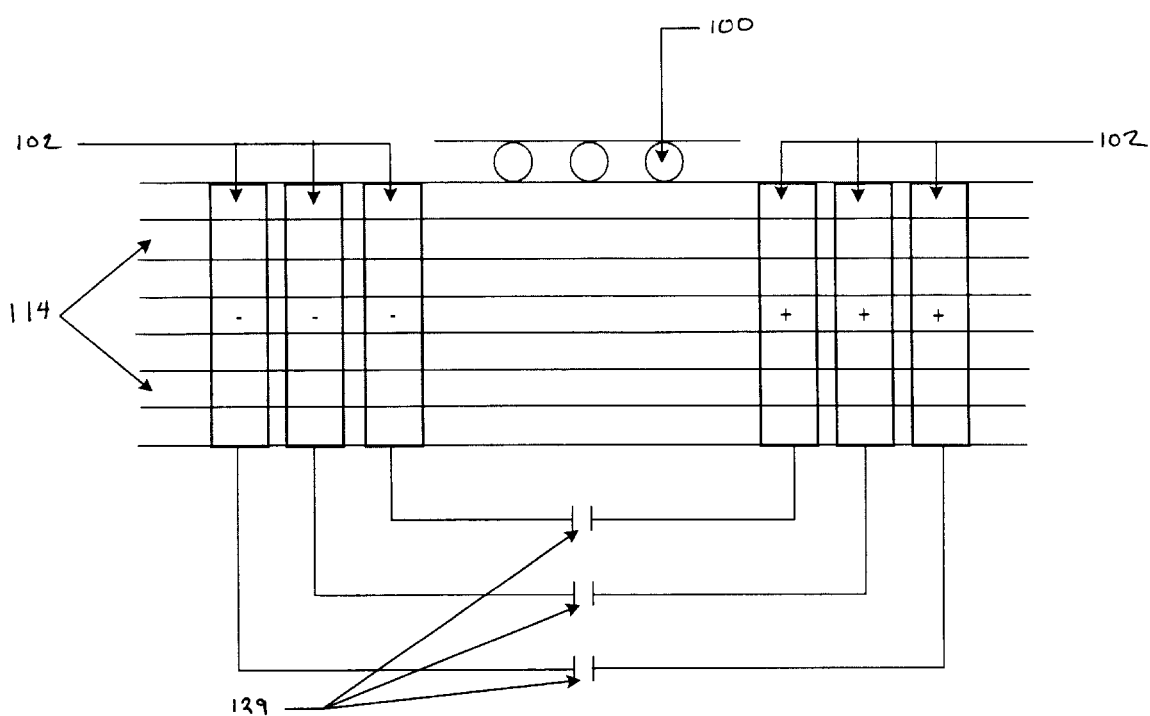
FIGS. 4a shows an exemplary side view showing how vias and capacitors are connected.

FIG. 4a shows an exemplary embodiment of a BGA according to one aspect of the invention. In this embodiment, balls 100 are positioned on a surface of a multilayer substrate 114, which preferably contains approximately eight or more traces per layer. Vias 102 extend from a first surface of substrate 114 to a second surface of the substrate, which includes via connection points. Bypass capacitors 129 may be attached to the via connections on the second surface to reduce overall system inductance.

Figure 4B:
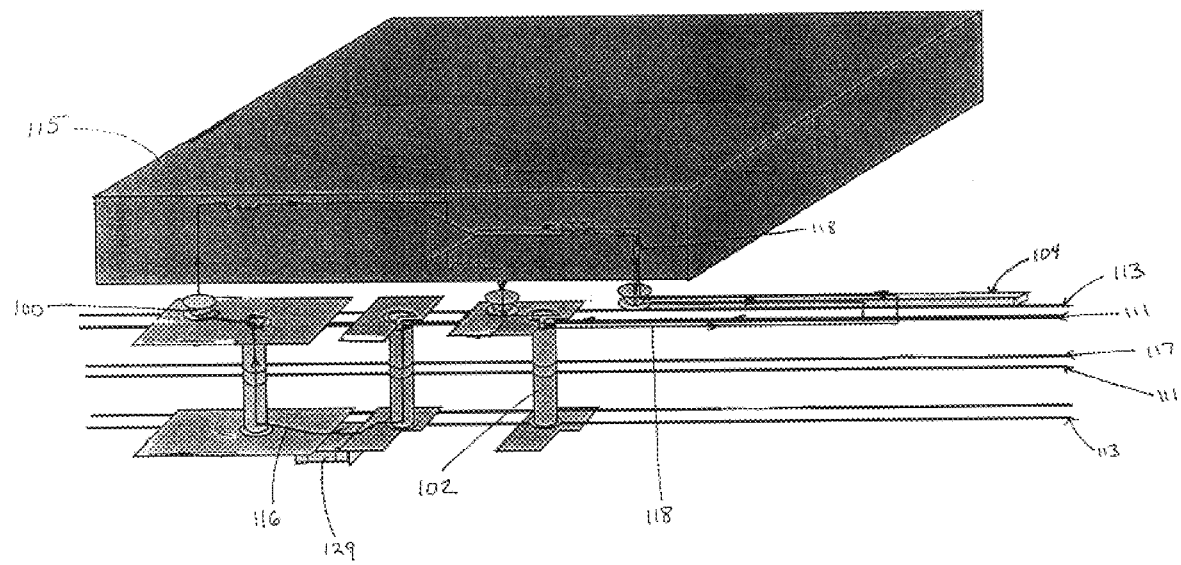
FIGS. 4b and 4c are side views of a printed circuit board and package illustrating the flow of the return path current.
Figure 4C:
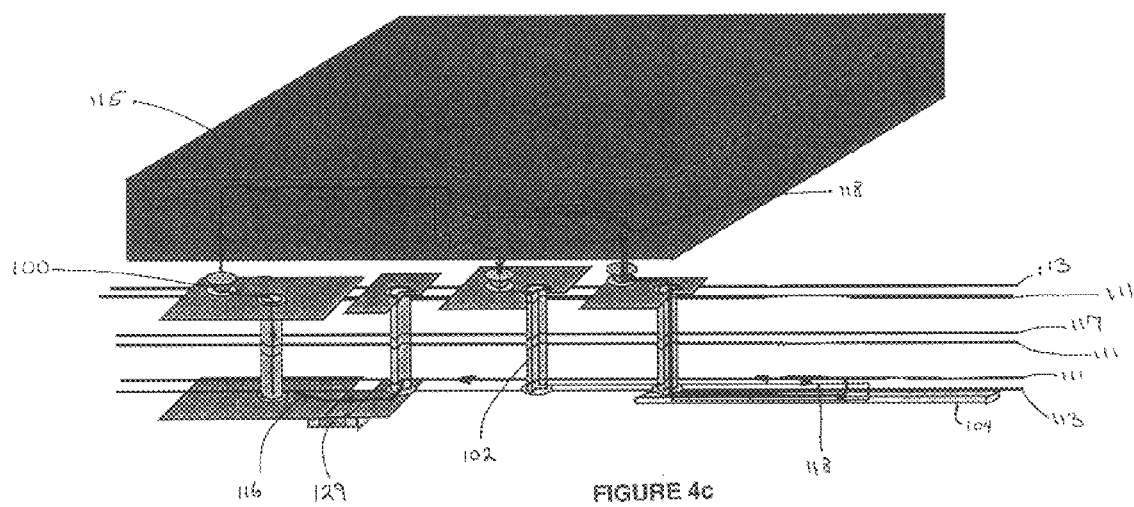

FIGS. 4b and 4c illustrate the length and flow of the return current path in a circuit. FIG. 4b shows the return current path for a trace 104 near the top surface of printed circuit board 113. FIG. 4c shows the return current path for a trace 104 near the bottom surface of printed circuit board 113. The current path in both figures is similar. As shown in FIGS. 4b and 4c, package 115 is connected to a printed circuit board 113 using balls 100. Printed circuit board 113 is a multilayer substrate in which are positioned ground traces 111, vias 102, and a power lead 117. Typically, power lead 117 is biased to approximately 1.0 to 2.0 V. A capacitor 129 links via 102 with ball 100. Current flow is illustrated by arrowed lines that form two closed loops. The loop designated by the clockwise pointing arrows illustrates the rising edge current path 116. The loop designated by the counterclockwise pointing arrows illustrates the falling edge current path 118. In an illustrative return current path embodiment, signal routes will be adjacent to the ground plane 111. Thus, the current to pull the signal line high must navigate the $V_{ss}$—via/bypass_capacitor/$V_{dd}$—via circuit. The inductance in the circuit creates a voltage drop which is a transient dip in the rail voltage. A droop in the rail voltage leads to a delayed valid edge for low to high simultaneous switching outputs (SSO). Compromising the suggested via pattern will result in more inductance and a larger SSO timing term, hence less timing margin.

Figure 5:
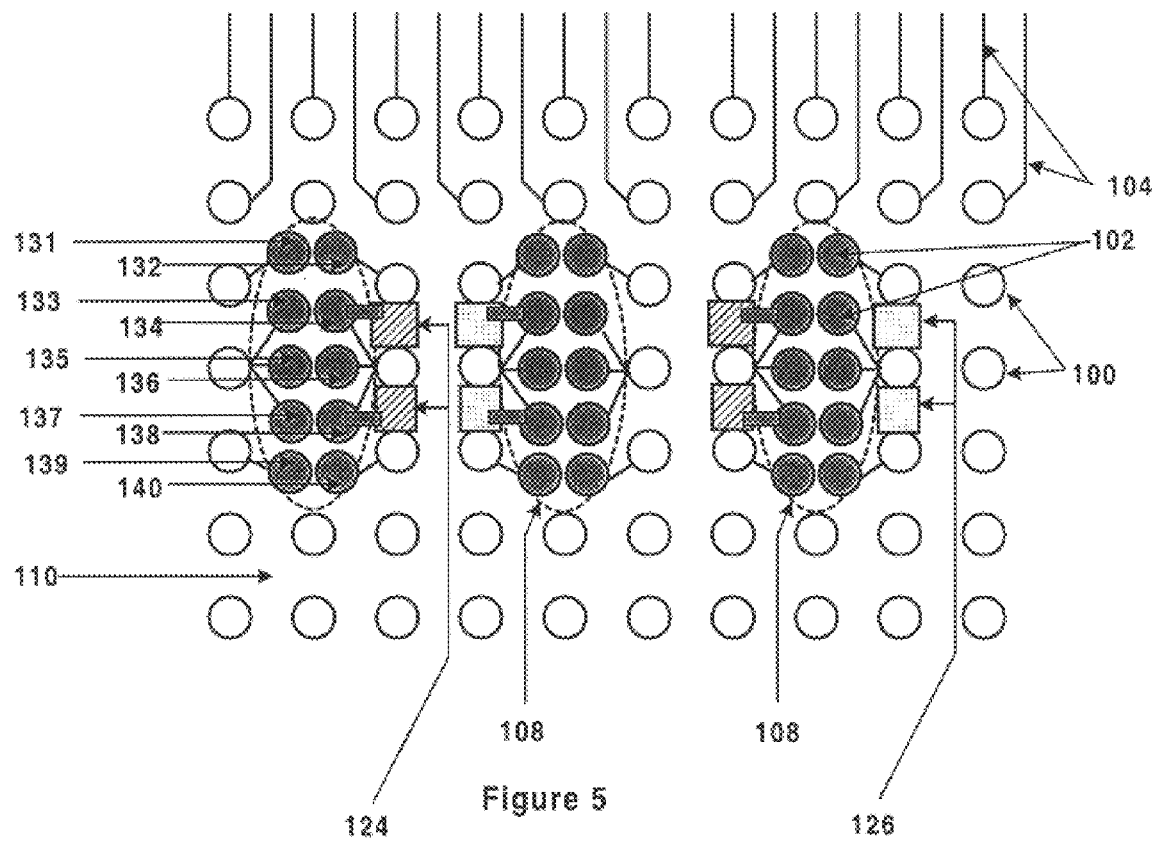
FIG. 5 is an overhead view of a BGA showing the placement of capacitors.

FIG. 5 shows a BGA further modified according to an illustrative embodiment of the present invention. In this embodiment, ball pitch is approximately 1.0 mm, and open spaces 108 have been filled with approximately ten vias each. The phrase "approximately 1.0 mm" includes a range of 0.2–2.0 mm. The phrase "approximately ten vias" includes a range from one to more than one via, depending upon the area encompassed by open space 108 and depending on the ratio of via inductance to ball inductance. For example, ten vias fit comfortably within an open space 108 of a size equal to the area encompassed by three adjacent balls, whereas four vias might fit comfortably within an open space 108 of a size equal to the area encompassed by one ball or two adjacent balls. The preferable "via pattern" is illustrated and described below with reference to FIGS. 6 and 7.

In the embodiment of FIG. 5, overall system inductance has been reduced by connecting a first set of capacitors 124 and a second set of capacitors 126 to vias 102 and balls 100. In FIG. 5, capacitors 124 and 126 look like two squares spaced apart. The connections linking capacitors 124 and 126 with vias 102 appear in FIG. 5 as horizontal rectangles, which have been drawn smaller than normal so one can see traces 104 underneath. In a preferred embodiment, capacitors 124 and 126 are connected to vias 102 by a region of copper. In some embodiments, it is important to place approximately two bypass capacitors per $V_{dd}$ ball because dual capacitors lower the equivalent series inductance. Additionally, connections routed from vias 102 to capacitors 124 and 126 should be a direct path having as wide an as short a trace 104 as constraints allow. In a preferred embodiment, one of the constraints is that approximately eight internal routes are required between each "10 via pattern." Illustratively, capacitors 124 are 0402's having an illustrative capacitance of 0.1 uF to 0.01 uF, and capacitors 126 are 0402's having an illustrative capacitance of 0.1 uF.

Figure 6:
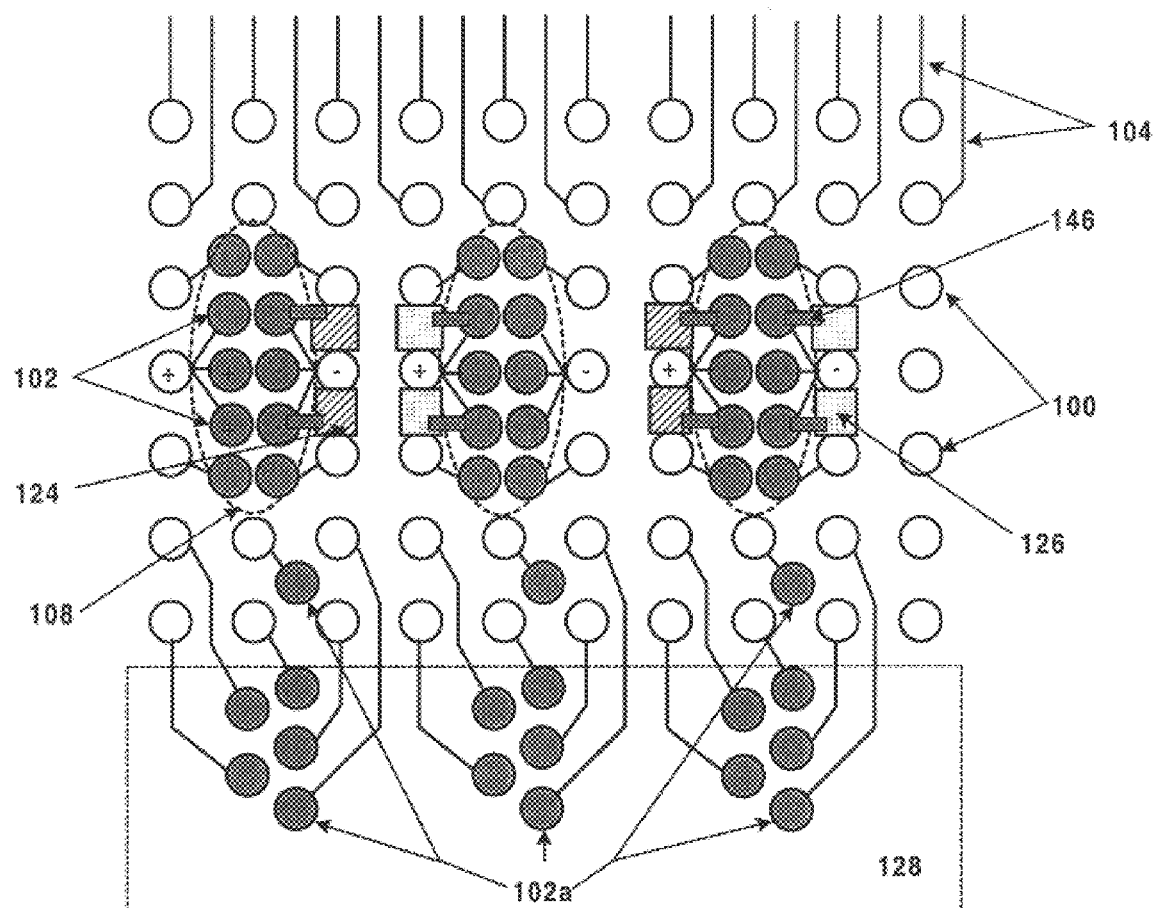
FIG. 6 is an overhead view of a BGA showing the placement of vias within a core area of the BGA.

FIG. 6 illustrates a preferred "via pattern," in which a ground via and a power via are combined to form a via pair 107 to minimize current path inductance by exploiting mutual inductance between vias of opposite current flow. Preferably, via pairs 107 are substantially vertically aligned with open space 108. The four corner vias (131, 132, 139, and 140) are linked to the nearby signal balls, while three vias (133, 135, 137) connect to each $V_{dd}$ ball and three vias (134, 136, 138) are connected to each $V_{ss}$ ball.

The BGA illustrated in FIG. 6 has core area 128. In a preferred embodiment, vias 102a positioned within core area 128 are formed in two substantially vertical, staggered rows. Moreover, the ball grid array preferably includes 19.4 mil BGA pads 4 mil traces, 4 mil gaps between traces, and 22 mil vias. Approximately ten traces 104 are routed on layer three of the substrate 114. Routing may be further facilitated by positioning additional vias 102a within core area 128 and within the interior rows of balls 100 immediately adjacent to core area 128.

Figure 7:
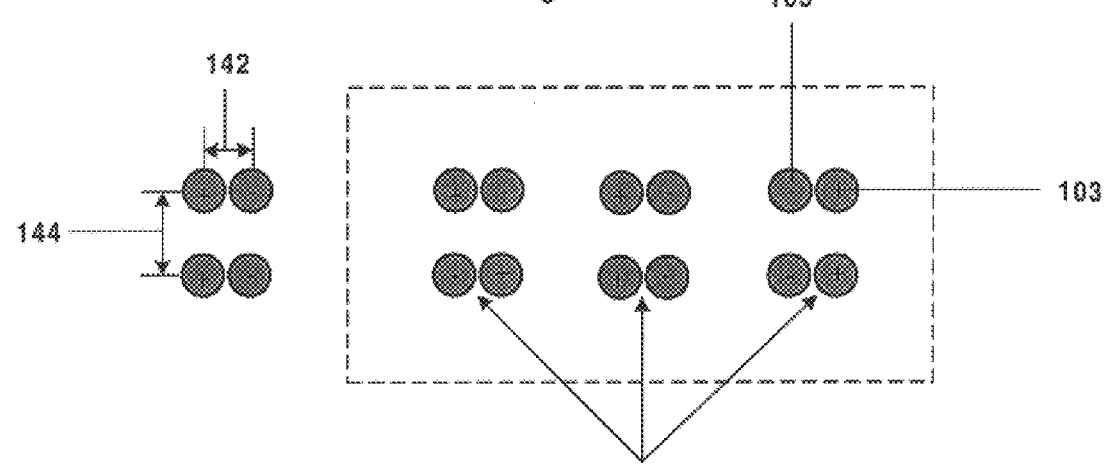
FIG. 7 is an overhead view of a via pair illustrating a preferred via pitch and preferred pair pitch. Alternate pairing designs are also shown.

FIG. 7 illustrates how vias are paired according to a preferred embodiment of the present invention to minimize current path inductance by exploiting mutual inductance between vias of opposite current flow. In this embodiment, distance 142 between vias of opposite current flow is minimized while the distance between vias of same direction current flow is maximized. This unique configuration maximizes mutual inductance between + vias 103 and – vias 105 (opposite sign) vias, which has the beneficial effect of lowering overall system inductance and improving the circuit's performance.

Figure 7A:
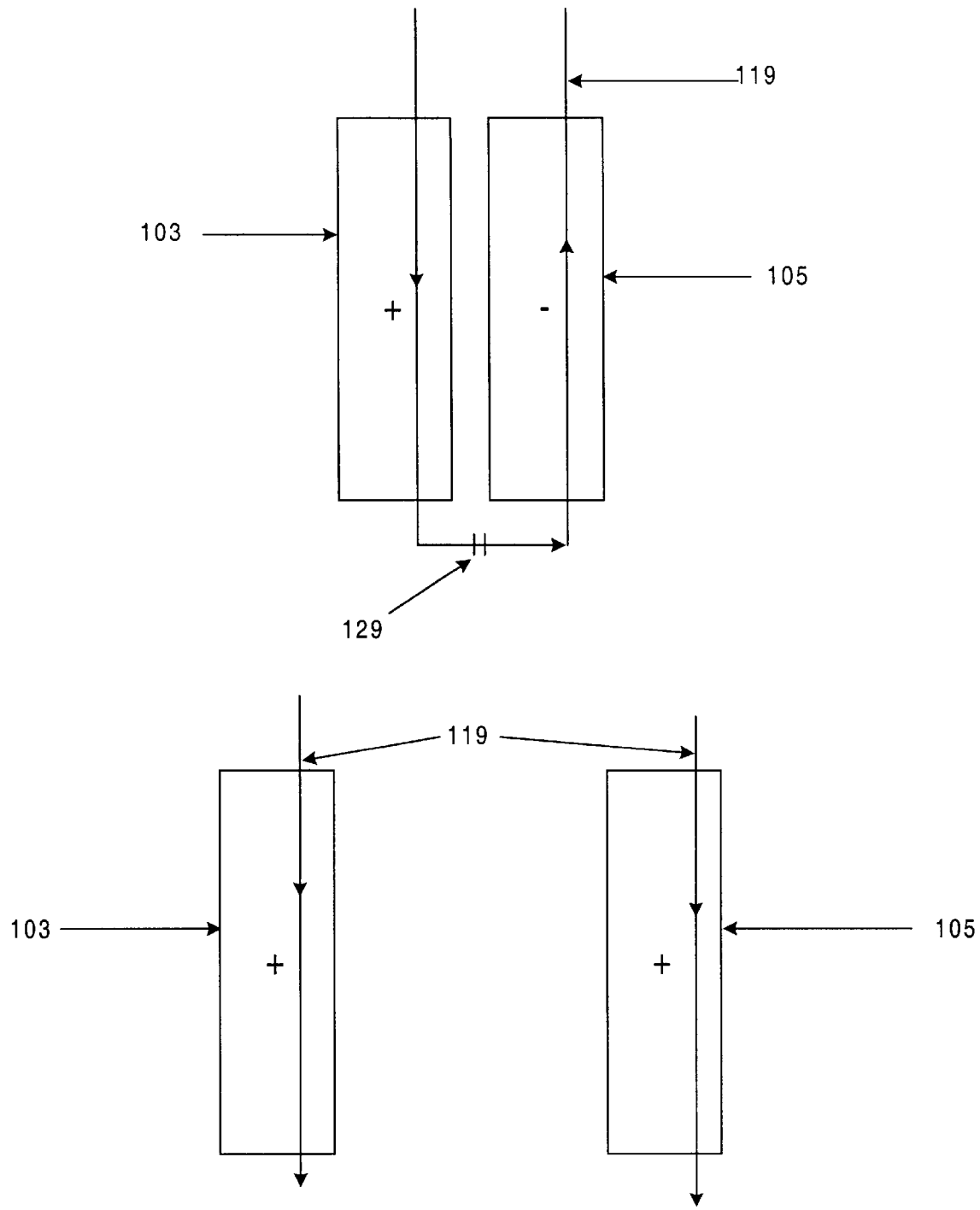
FIG. 7a is a side view of two via pairs. The top via pair shows how placing vias of opposite polarity adjacent to each other improves mutual inductance. The bottom via pair illustrates the necessity of spacing same polarity vias apart to lower overall system inductance.

For example, as shown by the direction of current flow represented in FIG. 7a, it can be seen that the mutual inductance resulting from opposite current flows in + via 103 and – via 105 reduces system inductance. The current induced in via 103 flows opposite to the current induced in via 105. Thus, the induced currents effectively cancel each other out. It can also be seen from FIG. 7a that vias of the same net (polarity)(e.g. + vias 103 or – vias 105) should be spaced as far apart as routing and spacing constraints allow because the current induced in one via effectively adds to the current induced in the second, same net, via, thereby increasing inductance and slowing i/o times.

It is understood that the illustrative groupings of two pairs of vias shown in FIG. 7 may be consecutively repeated as many times as spacing within an open space 108 allows. It is also understood that the groupings of via pairs shown in FIG. 7 are illustrative only, and that the present invention is not limited to the particular combinations illustratively depicted. Rather, various embodiments of the present invention include any combination of vias that increases mutual inductance between vias of opposite flowing current, while decreasing mutual inductance between vias having current that flows in the same direction.

System inductance is further lowered in some preferred embodiments of the present invention by creating short routing lengths between the connections that link $V_{dd}$ balls to $V_{dd}$ vias. that link $V_{dd}$ vias to the $V_{dd}$ terminal of the capacitors, that link $V_{ss}$ balls to $V_{ss}$ vias, and that link $V_{ss}$ vias to the $V_{ss}$ terminal of the capacitors. In some embodiments, lowered system inductance results from linking multiple vias 102 per ball 100 and from linking multiple capacitors 124 and 126 to $V_{ss}/V_{dd}$ via pairs 107. In some embodiments, the board technology that allows the desired via placement within open spaces 108 is: 4 mil traces, 4 mil spacing between traces, and 22 mil vias. Once the ball pattern is escaped, the route pitch should increase to 10 mils. If the dielectric is made less than 4 mils, a closer trace pitch can be used.

Figure 8:
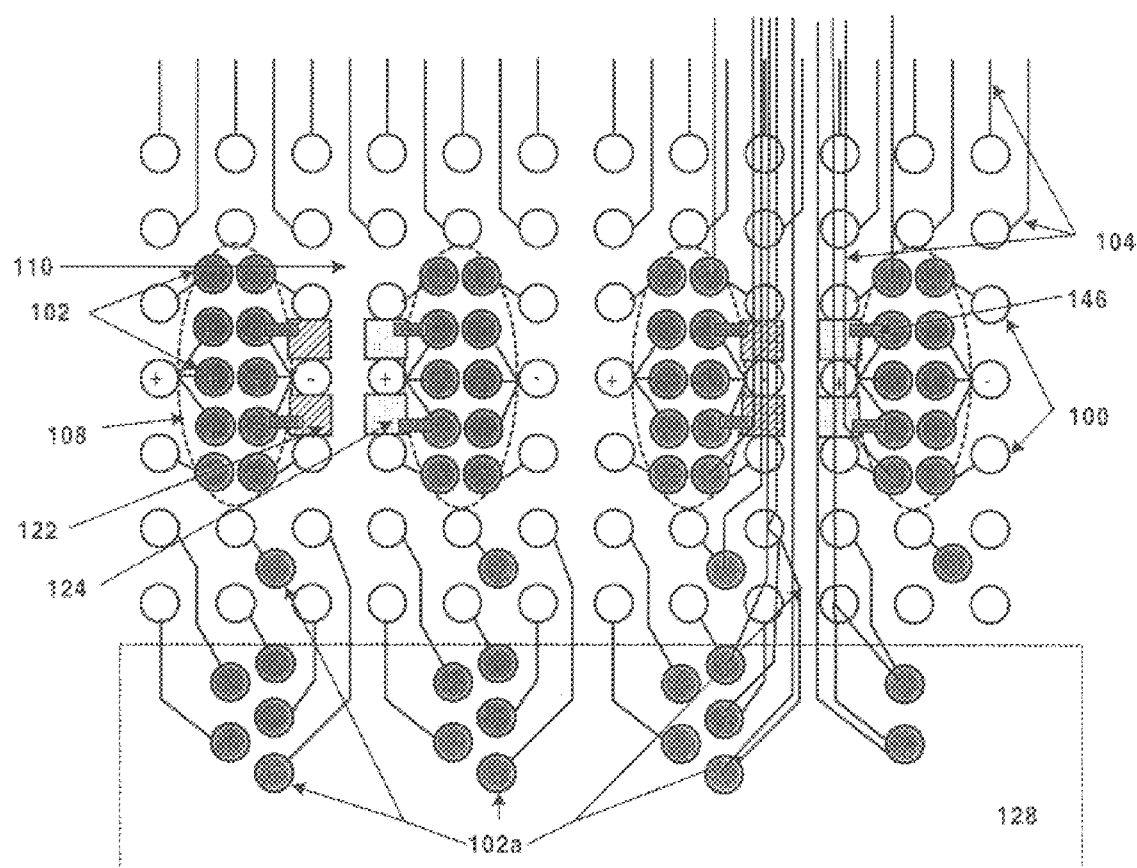
FIG. 8 is an overhead view of a BGA according to a preferred embodiment of the present invention showing how traces are routed.

FIG. 8 illustrates a complete ball grid array arranged according to a preferred embodiment of the invention. According to an exemplary embodiment of one aspect of the present invention, open spaces 108 can each contain a ten-via pattern, in which three ground vias are paired with three power vias 102, and the remaining four vias are signal vias. Alternatively, five via pairs can be formed in which five ground vias are paired with five power vias. In this embodiment, spacing between individual power and ground vias is minimized, while spacing between via pairs 107 is maximized within the space constraints to maximize mutual inductance between vias of opposite current flow.

In the embodiment illustratively shown in FIG. 8, only + vias 103 and − vias 105 are powered $V_{dd}$ and $V_{ss}$, respectively. Moreover, traces 104 are used to link balls 100 to vias 103 and 105 within open areas 108 and to link balls 100 to vias 102a located within core area 128 and exterior rows 106. In this illustrative embodiment, capacitors 124 and 126 are each connected to vias 102 by a region of copper representatively illustrated by small horizontal rectangles 146.

It is important to place two bypass capacitors per $V_{dd}$ ball as shown on the example layout placement template, because the dual capacitors lower the equivalent series inductance. Moreover, connections from the vias 102 to the capacitors 124 and 126 should be a direct-path with as wide and as short of traces as constraints allow. One constraint is that eight internal routes are required between each "10 via pattern," as shown in FIG. 8.

The invention has been described in detail with reference to particular illustrative embodiments. It is understood that variations and modifications of the invention can be effected within the spirit and scope of the invention and as defined in the appended claims.

We claim:

1. An electronic package, comprising:
   a multilayer substrate having a first surface and a second surface;
   a grid of electrically conductive solder balls disposed on the second surface of the substrate at a first pitch one from the other, the grid having at least one depopulated region therein;
   a grid of electrically conductive vias disposed within the depopulated region at a second pitch one from the other, one or more of the vias extending from the second surface to one or more layers of the substrate; and
   a plurality of electrically conductive traces for making electrical interconnections between the balls and the vias.

2. The package of claim 1, wherein the second pitch is less than the first pitch.

3. The package of claim 1, further comprising:
   one or more capacitors disposed on the second surface of the substrate and coupled with one or more of the vias.

4. The package of claim 1 wherein the depopulated region approximates an area occupied by one of the solder balls.

5. The package of claim 1 wherein the depopulated region approximates an area occupied by three adjacent solder balls.

6. The package of claim 1 wherein vias of the same polarity are separated as much as possible within area constraints without lengthening routing paths.

7. The package of claim 1, wherein the grid of electrically conductive solder balls has a pitch in the range of approximately 0.2 mm to approximately 0.49 mm.

8. The package of claim 1, wherein the grid of electrically conductive vias comprises a first plurality of vias having a first polarity and a corresponding second plurality of vias having a second opposite polarity.

9. The package of claim 8 wherein the first and second pluralities of vias are organized into a plurality of via pairs, each via pair consisting of one of the first plurality of vias having a first polarity and one of the second plurality of vias having a second opposite polarity.

10. The package of claim 9, wherein the via pairs are positioned within the depopulated region so as to maximize mutual inductance between vias of opposite polarity.

11. The package of claim 9 wherein the depopulated region approximates an area occupied by three adjacent solder balls and wherein approximately five via pairs are disposed within the depopulated region.

12. An electronic package, comprising:
    a multilayer substrate having a first surface and a second surface;
    a grid of electrically conductive solder balls disposed on the second surface of the substrate at a ball pitch one from the other, the grid having at least one depopulated region therein;
    a grid of electrically conductive via pairs disposed within the depopulated region at a via pitch one from the other, wherein individual vias of the via pairs extend from the second surface to one or more layers of the substrate, wherein the via pairs are positioned to maximize mutual inductance between vias of opposite polarity; and
    a plurality of electrically conductive traces for making electrical interconnections between the balls and the vias.

13. The package of claim 12, wherein individual vias within each via pair are positioned to maximize mutual inductance between vias of opposite polarity.

14. The package of claim 12, wherein the via pitch is less than the ball pitch.

15. The package of claim 12, wherein each via pair of the grid of electrically conductive via pairs consists of a first via having a first polarity and a second via having a second opposite polarity.

16. The package of claim 12, wherein the depopulated region approximates an area occupied by one of the solder balls.

17. The package of claim 12, wherein the depopulated region approximates an area occupied by three adjacent solder balls.

18. The package of claim 17 wherein approximately five via pairs are disposed within the depopulated region.

19. The package of claim 12, wherein vias of the same polarity are separated as much as possible within area constraints without lengthening routing paths.

20. The package of claim 12, wherein the ball pitch is in the range of approximately 0.2 mm to approximately 0.49 mm.

21. The package of claim 12, further comprising:
    one or more capacitors disposed on the second surface of the substrate and coupled with one or more of the vias.

22. A method, comprising:
    providing a multilayer substrate having a first surface and a second surface;
    forming a grid of electrically conductive vias within a depopulated region of a grid of solder balls attached to the second surface of the substrate, the depopulated region having an area approximately equal to an area occupied by a solder ball; and
    connecting one or more of the solder balls with one or more of the vias using a plurality of traces formed on the bottom surface of the substrate.

23. The method of claim 22, wherein forming a grid of electrically conductive vias further comprises:

pairing vias of opposite polarity together to form a plurality of via pairs, each via pair having a first via having a first polarity and a second via of a second opposite polarity.

24. The method of claim 23, further comprising:

positioning the via pairs within the depopulated region so as to maximize mutual inductance between vias of opposite polarity.

* * * * *